US005585020A

United States Patent [19]
Becker et al.

[11] Patent Number: 5,585,020
[45] Date of Patent: Dec. 17, 1996

[54] PROCESS FOR THE PRODUCTION OF NANOPARTICLES

[76] Inventors: Michael F. Becker, 2734 Trail of Madrones, Austin, Tex. 78746; James R. Brock, 1801 Lavaca, Apt. 6E, Austin, Tex. 78701-1305; John W. Keto, 1808 Basin Ledge, Austin, Tex. 78746

[21] Appl. No.: 333,754

[22] Filed: Nov. 3, 1994

[51] Int. Cl.$^6$ ................................................. B23K 26/00
[52] U.S. Cl. ........................ 219/121.85; 75/345; 241/1; 264/400
[58] Field of Search ........................ 219/121.6, 121.61, 219/121.66, 121.69, 121.84, 121.85; 75/342, 345, 10.13; 264/10, 15, 400, 482; 241/1

[56] References Cited

U.S. PATENT DOCUMENTS

| | | | |
|---|---|---|---|
| 4,014,964 | 3/1977 | Probst et al. | 219/121.66 |
| 4,226,369 | 10/1980 | Botts et al. | 241/1 |
| 4,289,952 | 9/1981 | Haggerty | 219/121.6 |
| 4,472,513 | 9/1984 | Menger-Hammond et al. | 75/345 |
| 4,814,003 | 3/1989 | Bergner | 75/10.13 |
| 5,044,565 | 9/1991 | Alexander . | |
| 5,176,328 | 1/1993 | Alexander . | |
| 5,227,608 | 7/1993 | Yoshida et al. | 219/121.84 |
| 5,390,864 | 2/1995 | Alexander . | |

OTHER PUBLICATIONS

Cannon et al., "Sinterable Ceramic Powders from Laser-Driven Reactions: I. Process Description and Modeling", *J. Am. Ceram. Soc.*, 65:324 (1982).
Borsella et al., "Investigation of the Mechanism of Pulsed $CO_2$ Laser-driven Production of Ultrafine Sinterable ($Si_3N_4$ and SiC) Powders", *Appl. Surf. Sci.*, 36:213 (1989).
M. Kato, "Preparation of Ultrafine Particles of Refractory Oxides by Gas Evaporation Method", *Jap. J. of Appl. Phys.*, 15:757 (1976).
Granqvist and Buhrman, "Ultrafine metal particles", *J. of Appl. Phys.*, 47:2200 (1976).
Uyeda, R., "Studies of Ultrafine Particles in Japan: Crystallography. Methods of Preparation and Technological Applications", *Progr. Material Sci.*, 35:1–96 (1991).
Gleiter, H., "Nanocrystalline Materials", *Prog. Mater. Sci.*, 33:223–315 (1989).
Mandich et al., "Reactive etching of positive and negative silicon cluster ions by nitrogen dioxide", *J. Chem. Phys.*, 86:4245–4257 (1987).
Dietz et al., "Laser production of supersonic metal cluster beams", *J. Chem. Phys.*, 74(11) : 6511–6512 (1981).
LaiHing et al., "Photoionization dynamics and abundance patterns in laser vaporized tin and lead clusters", *J. Chem. Phys.*, 87(6) : 3401–3409 (1987).
Poulain et al., "Interactions of Intense Ultraviolet Laser Radiation with Solid Aerosols", *J. Appl. Phys.*, 67:2283 (1990).
Juang et al., "Synthesis of nanometer glass particles by pulsed-laser ablation of microspheres", *Applied Phys. Lett.*, 65(1) : 40–42 (1994).
Carls and Brock, "Propagation of laser breakdown and detonation waves in transparent droplets", *Opt. Lett.*, 113:273 (1988).

Primary Examiner—Teresa J. Walberg
Assistant Examiner—Gregory L. Mills
Attorney, Agent, or Firm—Arnold, White & Durkee

[57] ABSTRACT

Nanoparticles are produced by exposing microparticles to an energy beam, particularly to a beam of laser light, above the ablation threshold of the microparticles. Nanoparticles are produced having a narrow size distribution.

21 Claims, 4 Drawing Sheets

PROCESS FOR THE PRODUCTION OF NANOPARTICLES

The U.S. Government may have a paid-up license in this invention and the right in limited circumstances to require the patent owner to license others on reasonable terms as provided for by the terms of Grant No. ECS-9119043, awarded by the National Science Foundation under the Emerging Technologies Initiation Program.

BACKGROUND OF THE INVENTION

This invention relates to the use of laser light to ablate materials.

Recently, nanoparticles have been the focus of much research. Certain governmental agencies around the globe have indicated efficient methods of nanoparticle production is desired, and funding toward such research has ensued. Nanoparticles of a variety of materials are interesting because such particles sometimes exhibit different physical properties as compared to larger sized particles of the same material. Ferrous oxide (rust), for instance, is white and translucent and magnetic when of nanoparticle size.

In addition, it has been suggested that ceramic materials, such as $Si_3N_4$ and SiC, of higher quality may be produced when the starting materials are of small size, free of agglomeration, in a narrow range of sizes, of spherical shape and of high purity. Most powders do not possess these characteristics. Methods of making such starting materials in large volume is highly desirable.

Previously, the production of nanoparticles has been by methods such as vacuum synthesis, gas-phase synthesis, condensed phase synthesis, high speed deposition by ionized cluster beams, consolidation, high speed milling, mixalloy processing, deposition methods and sol-gel method. These methods suffer from a variety of defects including agglomeration, broad size distribution, or low volume production.

Additionally, nanoparticles have been produced by ablation of bulk, planar surfaces using laser light. This method does produce nanoparticles, but energy requirements are undesirably high and yield of nanoparticles is undesirably low. Moreover, the size distribution of nanoparticles using this method is broad.

It can be seen new methods of nanoparticle production would be highly desirable. It can further be seen that it would be desirable if such new methods produced nanoparticles in good yield, at higher efficiencies, and to provide a more narrow size distribution of nanoparticles.

SUMMARY OF THE INVENTION

In one respect, this invention is a process useful for making nanoparticles, comprising: exposing microparticles to an energy beam that is effective to ablate the microparticles under conditions such that nanoparticles are formed, the microparticles having a particle density less than $1\times10^9$ particles per cubic centimeter.

In a second respect, this invention is a process useful for producing nanoparticles having a diameter in the range from 1.0 to 1000 nanometers, comprising illuminating microparticles having a diameter in the range from about 1 to about 1000 microns with laser light under conditions such that nanoparticles are formed, the laser light having sufficient intensity and appropriate wavelength such that the plasma formation threshold of the microparticles is exceeded by a factor of at least 1.5, and wherein individual microparticles are substantially free from contact with other microparticles while being illuminated with laser light.

In a third respect, this invention is a process useful for making nanoparticles, comprising: illuminating microparticles having a mean diameter greater than about 1 micron and less than about 100 microns with laser light of a wavelength and an intensity effective to produce nanoparticles having a dispersion less than about 0.5, wherein the microparticles have a particle density of less than $1\times10^9$ particles per cubic centimeter.

The present invention provides a process for producing a size distribution of nanoparticles in a narrow range. A novel feature of the invention is the use of solid starting materials in the range from about 1 to 1000 microns wherein the microparticles are exposed to an energy beam, preferably illuminated with laser light, while the microparticles are substantially free of contact between each other. Surprisingly, use of starting materials in this range without contact of the microparticles results in the production of nanoparticles in a narrow width of size distribution having minimal agglomeration. This invention advantageously provides a narrow range of size distribution, thereby obviating the need to mechanically or otherwise separate particles when a given particle size distribution is needed for a particular end use for the nanoparticles. Additionally, the present invention is susceptible to being scaled up for efficient and large scale production of nanoparticles. The present invention further provides an efficient process in that a large fraction of the mass of each microparticle is converted to nanoparticles (typically greater than 10 percent, depending on process conditions). A distinct advantage of the present invention is that the nanoparticles produced are generally not agglomerated. Another advantage of this invention resides in the ability to form a particular average particle size of nanoparticles by properly selecting the power of the energy beam, such as selecting the wavelength or fluence of laser light. Another advantage of the present process is that the high purity nanoparticles are produced cleanly, in an environmentally acceptable manner.

Nanoparticles produced in accordance with this invention have a variety of uses depending on the type of microparticle employed as a starting material. For example, gold nanoparticles can be used in the electronics industry to form the conductive portions of a circuit board. It is contemplated that a narrow size distribution and smaller sized gold nanoparticles will enable the construction of circuit boards wherein the conductive path is more narrow, thereby enabling a greater number of conductive pathways to be incorporated on the circuit board in a given unit area.

It is known that nanoparticles oftentimes exhibit properties different from the same material in a larger size. For instance, ferrous oxide normally has a reddish brown color (rust) and is not magnetic, but nanoparticles of ferrous oxide are translucent and highly magnetic. Hence, it can be seen that implementation of the present invention could lead to the production of nanoparticles with material properties heretofore unknown, which might have useful properties also heretofore unknown for the particular material.

It has been found that illuminating flat plates, cylindrical surfaces or similarly shaped materials as well as powders contained in a restrained volume such that a bulk material is approximated (such as, for example, sand in a sandbox) with laser light requires significantly more intense light to ablate portions of such surfaces than is required in the practice of the present invention. Generally, ten times as much power is required to ablate such surfaces than is needed in the practice of this invention wherein microparticles are illuminated. Moreover, the ablation of such large surfaces, while generating some amount of nanoparticles, leads to a broad size distribution of the nanoparticles so produced. In terms of spread, the percentages are generally greater than 60%, versus spreads generally less than 30% in the practice of this invention, wherein the nanoparticle distribution is log-normal with a smaller mean diameter than those from flat plate ablation. Ablation of such plane surfaces has solid, liquid and vapor phases coexisting with the possibility of ejecting a large solid or liquid mass of material. By contrast, in the practice of this invention, the microparticles appear to be substantially vaporized.

DETAILED DESCRIPTION OF THE PREFERRED EMBODIMENTS

In the practice of this invention, microparticles are employed as starting materials in the production of nanoparticles. As used herein, microparticles have a diameter greater than the wavelength of the laser light. Generally, microparticles used in the practice of this invention have a diameter greater than about 1 micron; generally less than about 1000 microns, preferably less than about 100 microns.

The microparticles can be composed of a wide variety of materials. Generally, such materials are solids at room temperature and of types which are not susceptible to chemical degradation during the practice of this invention. Representative examples of suitable materials include silica, alumina, alloys, inorganic and organic compounds, metals such as gold, silver, palladium, nickel, iron, and oxides and sulfides thereof. It should be appreciated that a wide variety of materials can be used to make the microparticles for use in the practice of this invention. Thus, the present invention can be used on almost any material, subject to the proviso above.

An important feature in the practice of this invention is that such microparticles are of a size as described hereinabove. The microparticles can be of any shape; shape not being critical to the practice of this invention, although it should be appreciated shape may have some impact on light adsorption, plasma formation threshold and size of nanoparticles produced.

In the practice of this invention, during exposure to the energy beam and particularly illumination by laser light, the microparticles are substantially free of contact between individual microparticles. While some individual microparticles may be in contact during the process, the great majority of microparticles should not be in contact. The greater the number of microparticles that are in contact in a given mass of microparticles, the greater the microparticles as a whole will behave as a bulk material such as solid bar. Generally, less than 1% of microparticles are in contact while being illuminated with laser light to cause ablation. It should be understood agglomerates of microparticles can serve as the source of microparticles wherein the agglomerates have less than 10,000 primary particles per agglomerate. Preferably, the microparticles are not agglomerated. The particle density of microparticles during exposure to the energy beam is less than $1 \times 10^9$ particles per cubic centimeter.

The amount of contact between microparticles during exposure to the energy beam can also be described as being an amount effective to produce nanoparticles having a dispersion less than about 0.5, preferably less than about 0.4 and more preferably less than about 0.3. The term "dispersion" is defined hereinafter.

There are a variety of methods which can be employed to provide microparticles substantially free of contact during exposure to the energy beam. One simple method involves spreading microparticles over a surface such that substantially all the microparticles are free from contact with other microparticles. For instance, the microparticles can be distributed as by dusting the surface or by dispersing a water or alcohol suspension of microparticles using a nebulizer. Another method involves passing moving stream of gas over a bed of microparticles such that microparticles become entrained in the moving gas, the moving stream of gas thereafter passing through the energy beam. Alternatively, the microparticles can be pulled via a vacuum through the energy beam. In addition, defined quantities of microparticles can be dropped through energy beam, such as through use of a screw or plunger whereby a defined quantity of microparticles fall in a tube and through the energy beam. It should be recognized combinations of these and other equivalent techniques can be employed to provide microparticles substantially free from contact with other microparticles when exposed to the energy beam.

Several methods are known presently for making microparticles as starting material such as by chemical process, vapor deposition and spark erosion. Many types of microparticles are commercially available, presently.

In the practice of this invention, microparticles are exposed to an energy beam of sufficient energy to bring about ablation (vaporization) of the microparticle. The amount of energy required will vary depending on several variables including the size, shape, optical properties and material type of the microparticles.

The energy beam has sufficient energy to ablate the microparticles directly, without the microparticle being simply heated to liquify the material followed by boiling of the liquid to thereby vaporize a portion of the particle. Rather, in the practice of this invention, the microparticles are exposed to an intense energy beam to bring about ablation (vaporization) directly without the microparticle moving through a liquid phase. To bring about direct ablation of the microparticles, it is necessary to employ an energy beam of sufficient energy to exceed the plasma formation threshold of the microparticles by a factor of at least 1.5. By comparison, the heating/boiling/vaporization of materials generally employs energy of less than a factor of 1 of the plasma formation threshold. Determining the proper energy can be performed by routine experimentation wherein energy levels of the energy beam are increased and products observed. Once a factor of at least 1.5 of the plasma formation threshold is achieved the nanoparticles produced will have a dispersion less than 0.5 and be substantially free of agglomeration. Below a factor of 1.5 of the plasma formation threshold, the nanoparticles produced will have a broad particle distribution above 0.5. For 8 mm silica microparticles, the plasma formation threshold was found to be at a fluence of about 0.5 J/cm$^2$ using 1064 laser light.

The energy beam can be provided from a variety of sources such as from an ion beam, particle beam, electron beam, discharge heating and laser light. In a preferred embodiment of the present invention, a beam of laser light is employed as the energy beam.

The lasers that can be employed to generate the laser light used in the practice of this invention include any of the lasers commercially available. The laser employed can generate laser light having wavelengths in the range from 0.15 to 11 microns. Selection of a given laser is dependent on, for instance, the optical properties of the microparticles and the size of the nanoparticles desired. Similarly, the power of the laser required will also vary depending on these variables, but the laser employed is generally of a type capable of generating a fluence of about 0.1 to about 10 joules per square centimeter (J/cm$^2$) if a laser pulse of 1 to 100 nanoseconds is used or, if a pulse of laser light above or below 1 to 100 nanoseconds is used, then an irradiance of $10^8$ to $10^{11}$ watts per square centimeter (watts/cm$^2$). Preferably, the laser light has a wavelength of 0.15 to 11 microns. In one embodiment, the laser light has a pulse length in the range from 1 nanosecond to 20 nanoseconds.

The extent of monodispersion of nanoparticles prepared in accordance with this invention is calculated by the following equation: dispersion=σ/mean diameter, wherein "σ" is the standard deviation (in nanometers) of the diameters of nanoparticles in a sample and "mean diameter" is the mean diameter of the nanoparticles in the sample. In conventional terminology, nanoparticles are monodispersed when dispersion ≦0.2, in accordance with Fuchs' criteria. See generally N. A. Fuchs and A. G. Sutugin in Aerosol Science, (edited by C. N. Davies), Academic Press, New York (1966). Using the Fuchs' criteria, nanoparticles generated in accordance with this invention generally have a dispersion less than about 0.5, preferably less than about 0.4, more preferably less than about 0.3. It should be appreciated the dispersion of nanoparticles is impacted by the type of microparticles employed as starting material.

Determining the size distribution of the nanoparticles generated in accordance with practice of this invention typically requires a large number of individual nanoparticles so that a statistically significant distribution can be obtained. A scanning electron microscope ("SEM") can be used to obtain photomicrographs of nanoparticles. For instance, nanoparticles can be deposited on a silicon substrate and the surface of the silicon substrate can then be scanned to photograph the nanoparticles. The photomicrographs can also be digitized and image processed using well known methods. In addition, transmission electron microscopy can be used to obtain images of the nanoparticles.

In the practice of this invention, the mean diameter of nanoparticles produced can be adjusted by varying the energy of the energy beam, such as by varying the wavelength and intensity (fluence) of the laser light. At a given laser light wavelength, increasing fluence results in decreasing mean nanoparticle diameter for a given mean diameter of microparticle. In addition, increasing the mean diameter of the microparticle starting material at a given laser light wavelength and fluence leads to a decrease in mean diameter of the nanoparticles produced. Generally, larger fluence, higher optical energy inside a microparticle, or larger optical absorption of the microparticle leads to formation of nanoparticles of smaller mean diameter. There is also a correlation between wavelength and nanoparticle size which depends on the optical properties of the microparticles and, therefore, selection of wavelength can be used to control the size of nanoparticles produced.

In one embodiment of the present invention, microparticles are illuminated with laser light while the microparticles sit on a surface. For instance, microparticles can be deposited on a quartz plate by spreading the microparticles on the quartz surface as by dusting or by dispersing a water or alcohol suspension of microparticles using a nebulizer. Then, the laser of the desired fluence and wavelength can be focused on individual microparticles or on groups of microparticles. The quartz plate can be at any angle relative to the laser light; generally a 45 degree angle is employed. In this embodiment, the laser light is of a fluence and wavelength which does not damage the quartz surface.

Figure 1:
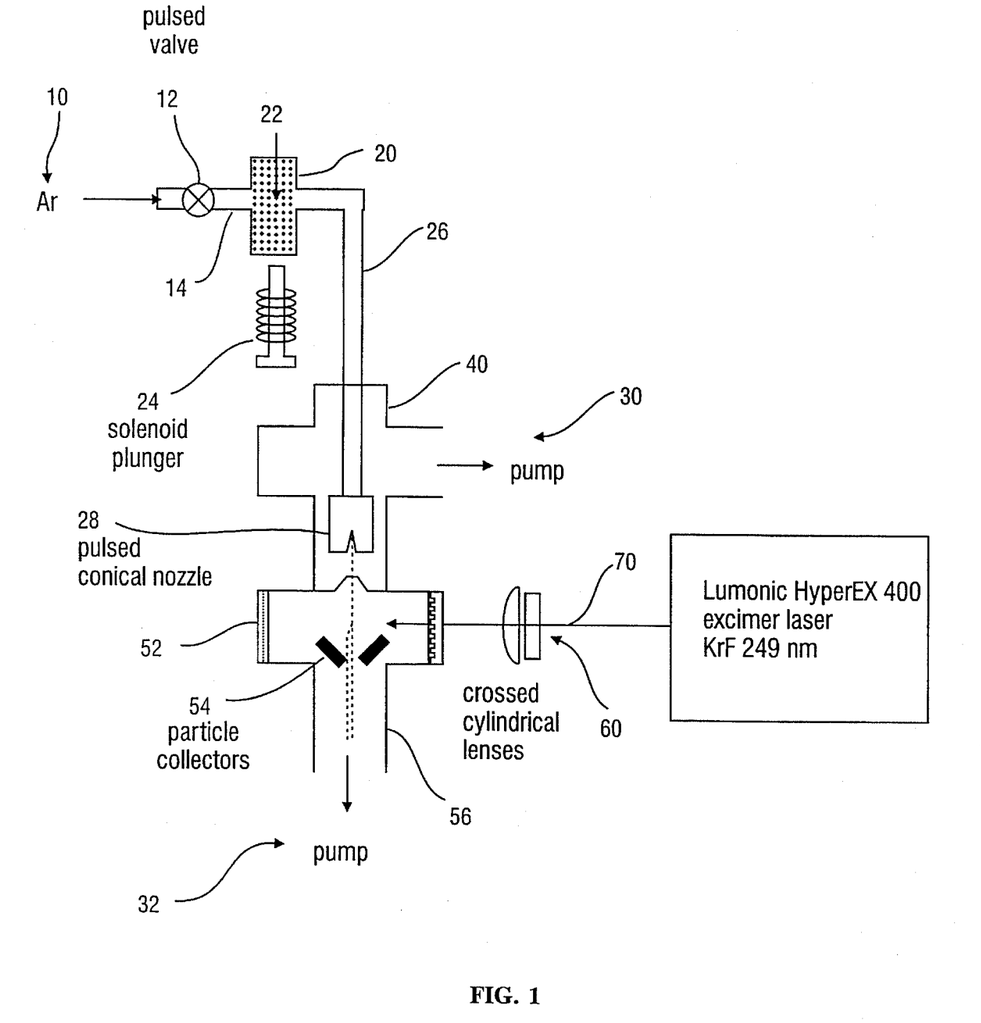
FIG. 1 shows a diagram of a process design in accordance with this invention.

In a second embodiment of the present invention, the microparticles are moved through the energy beam, for instance the laser light. Generally, when a laser is employed, a pulsed laser light is used to conserve power. In this embodiment, the microparticles can be moved through the stationary laser light as is shown in FIG. 1. In FIG. 1, argon or other gas inert to the microparticle enters line 14 upon the opening of pulsed valve 12 from line 10. Line 10 is connected to a pressurized argon gas source, not shown. The pulse of argon gas enters microparticle holder 20 and thereby comes into contact with microparticles 22 which have been brought into communication with the argon gas pulse by activation of solenoid plunger 24 which is activated simultaneous with opening of pulse valve 12. Thus, an amount of microparticles commensurate with the size, shape and type of microparticles, as well as with the amount, duration and velocity of the argon gas pulse, is entrained in the argon gas pulse, continuing through line 26 and entering the void formed from housing 40 through conical nozzle 28. A first vacuum pump 30 and a second vacuum pump 32 are continuously run to maintain a pressure of about 0.1 Torr in the void formed by housing 40 and exit housing 56. Such a vacuum pulls a jet of microparticles entrained in argon gas through laser light 28 from laser 70 where the microparticles are ablated to form nanoparticles. Laser light 70 is generated by a laser, not shown. The laser light 70 passes through crossed cylindrical lenses 60. The jet of microparticles can have a wide range of velocity depending on pressure, diameter of an opening in conical nozzle 28 and other factors; generally the jet of microparticles has a supersonic velocity. The speed of the jet of microparticles and the time length of the pulse of laser light can be adjusted such that the laser light illuminates the microparticles for the time needed to ablate a given quantity of microparticles, and then turns off until a fresh batch of microparticles is in the field of the laser light. Generally, a pulse of laser light has a time length of 0.05 to 100 nanoseconds when operated in accordance with the process illustrated in FIG. 1. The stream of microparticles and/or nanoparticles enter exit housing 56 after passing sample nanoparticle collectors 54.

It is apparent to those skilled in the art that the process design shown in FIG. 1 admits to other configurations, particularly for a commercial production specification. Moreover, it is contemplated that the present invention can be run using a nonpulsed laser, continuous entrainment of microparticles, no entrainment gas (in a vacuum), using a liquid entrainment fluid, nanoparticle collection by filter or other means further downstream of exit housing 56, using an entrainment gas only (no vacuum pumps) and so forth. Moreover, the present invention can be run at superatmospheric, atmospheric or subatmospheric pressures in the region where the microparticles are illuminated. Furthermore, temperature in the region surrounding microparticles prior to illuminating the microparticles with laser light is not critical to the practice of this invention, so long as the temperature is not so low or so high that the laser light does not ablate the microparticles.

The following examples are illustrative of the invention and are not to be construed to limit the scope of the invention or of the claims.

In the examples below, 248 nanometer ("nm") wavelength light was generated using a KrF excimer laser having a 12 nanosecond pulse length; 533 nm light was generated by a frequency-doubled Nd:YAG laser having an 8 nanosecond pulse length; and 1064 nm light was generated by a fundamental frequency Nd:YAG laser having a 10 nanosecond pulse length. The soda-lime glass microparticles employed in the examples had a mean diameter of 8.0±0.8 microns, 22.1±1.5 microns, 40.0±2.8 microns and 58.9±3.5 microns having dispersions of 0.25, 0.27, 0.26 and 0.25, respectively. The microparticles were obtained from Duke Scientific Corporation, Palo Alto, Calif.

EXAMPLE 1

ABLATION OF MICROPARTICLES ON A SURFACE

The lasers were focused onto a UV-transparent quartz slide where the soda-lime glass microparticles had been dispersed from a water suspension by a nebulizer. The slide was angled 45° to the incident laser beam. By translating the slide between laser pulses, individual microparticles could be irradiated by a single laser pulse. A well-cleaned silicon substrate facing the slide, directly above the irradiation spot, was used to collect the nanoparticles produced.

Figure 5:
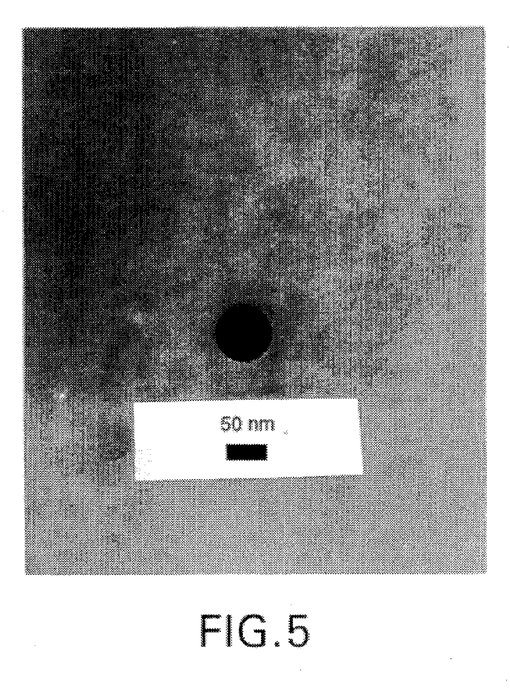
FIG. 5 shows a transmission electron micrograph of silica nanoparticle produced in Example 2.

Determining the size distribution of the nanoparticles required sizing a large number of individual particles. A scanning electron microscope (SEM) was used to generate a sequence of 5 to 10 photomicrographs of each silicon substrate, and the micrographs were subsequently digitized and image processed using conventional methods (NIH Image software). To measure the nanoparticle size, a threshold was defined as the perceptible difference between a nanoparticle and the background in the photomicrograph, and the size was measured between threshold points. Roughly 1000 nanoparticles were counted for each case. In addition, a transmission electron microscope (TEM) was used to obtain images of the nanoparticles generated at 1064 nm, but the number of nanoparticles in the image was not sufficient to obtain size distribution statistics. Although the shape of the smallest nanoparticles was not evident in the SEM micrographs, the TEM micrographs showed them to be spherical with no evidence of lattice planes as shown in FIG. 5.

Nanoparticle statistics are shown in Table 1 as a function of laser wavelength and fluence for initial microspheres 8 μm in diameter. The smallest mean diameter nanoparticles, 59 nm, were obtained at 248 nm at the highest laser fluence. The most nearly monodispersed nanoparticles were also produced at 248 nm but at 4.5 J/cm$^2$. In fact, the particles produced for many cases were nearly monodispersed.

TABLE 1

Normal and log-normal statistics of nanoparticle distributions prepared by laser ablation of 8 μm microspheres. The number of particles N is shown for each distribution.

| Fluence (J/cm$^2$) | N | mean dia (nm) | std. dev. σ (nm) | α = σ/dia. | geom. mean dia | Ln σg |
|---|---|---|---|---|---|---|
| Wavelength = 248 nm | | | | | | |
| 4.5 | 1136 | 79 | 19 | 0.24 | 77 | 0.23 |
| 6.0 | 1093 | 65 | 18 | 0.27 | 63 | 0.25 |
| 7.5 | 1116 | 59 | 19 | 0.31 | 56 | 0.31 |
| Wavelength — 533 nm | | | | | | |
| 4.0 | 493 | 115 | 43 | 0.37 | 109 | 0.310 |
| 6.0 | 469 | 103 | 35 | 0.34 | 99 | 0.26 |
| 9.0 | 560 | 92 | 31 | 0.34 | 88 | 0.28 |
| Wavelength — 1064 nm | | | | | | |
| 0.7 | 328 | 722 | 807 | 1.11 | 455 | 0.91 |
| 1.6 | 948 | 87 | 26 | 0.29 | 84 | 0.26 |
| 3.8 | 402 | 81 | 24 | 0.30 | 78 | 0.28 |
| 10.5 | 560 | 74 | 23 | 0.31 | 71 | 0.25 |
| 13.7 | 996 | 66 | 23 | 0.35 | 62 | 0.33 |

As can be seen by the small values of the higher-order moments, a log-normal distribution fits the data well. Irradiation near the ablation threshold (1064 nm at 0.7 J/cm$^2$) resulted in nanoparticles with a log-normal distribution plus some larger particles. The trend for the smallest mean size and dispersion at 248 nm and the opposite at 533 nm parallels the trend of both the optical extinction coefficient of the glass microparticles at these wavelengths and the peak optical energy density inside the microparticles. The data point at 0.7 J/cm$^2$ was near the ablation threshold of 0.5 J/cm$^2$ at 1064 nm; consequently, many large jagged fragments were collected along with a small number of nanoparticles. Thus, irradiation well above the ablation threshold is required for nanoparticle production to be effective, and the nanoparticle diameter can be controlled by adjustment of the laser fluence.

The nanoparticle size can also be controlled by varying the diameter (at a fixed wavelength) of the target microparticles. Data of this type is shown in Table 2 for irradiation at 1064 nm well above the ablation threshold. There appears to be a correlation between the mean size of the generated nanoparticles and the microparticle size.

TABLE 2

Normal and log-normal of nanoparticle distributions prepared from various sizes of microspheres irradiated by a 1064 nm Nd:YAG laser at 10.5 J/cm$^2$.

| Initial dia. (μm) | N | mean dia (nm) | std. dev. σ/(nm) | α = σ/dia. | geom. mean dia (nm) | Ln σg |
|---|---|---|---|---|---|---|
| 8 | 560 | 74 | 23 | 0.31 | 71 | 0.25 |
| 20 | 670 | 73 | 22 | 0.30 | 70 | 0.27 |
| 40 | 565 | 78 | 22 | 0.28 | 75 | 0.26 |
| 60 | 685 | 66 | 18 | 0.27 | 64 | 0.25 |

Figure 2A:
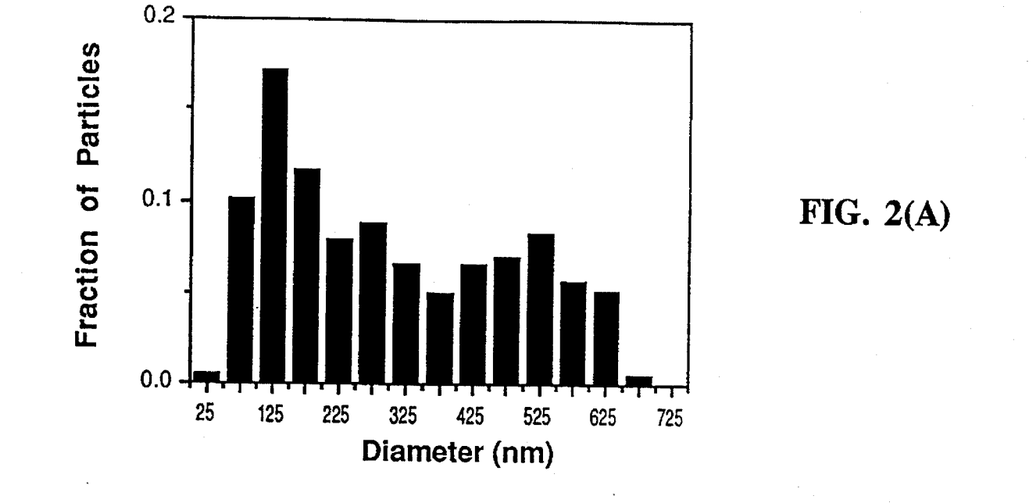
Figure 2B:
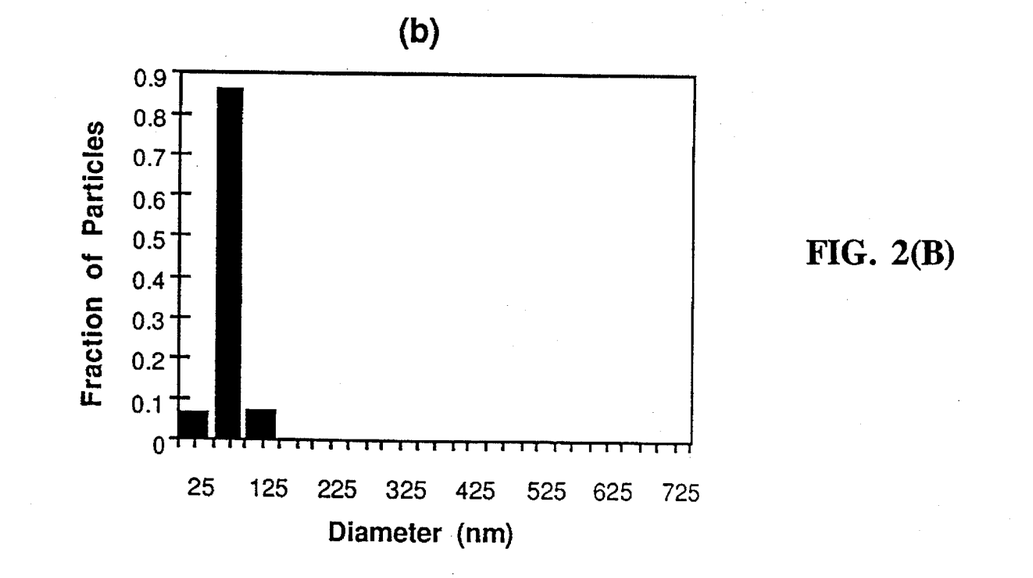
FIG. 2(B) shows histograms of the size distribution of silica nanoparticles produced from 8 micron microparticles in accordance with the practice of this invention using 1064 nm laser light at a fluence of 10.5 $J/cm^2$, and from a flat glass plate in FIG. 2(A) at a fluence of 10.0 $J/cm^2$ using 1064 nm laser light.

In addition, the ablation of 8 micron microparticles prepared in accordance with this invention was compared to nanoparticles produced from a flat glass plate under the same condition shown in Table 3 below. FIG. 2(A) is a histogram of the nanoparticles generated from a flat plate (not an embodiment of the invention) and FIG. 2(B) is a histogram from ablation of 8 micron particles prepared in accordance with this invention.

TABLE 3

Comparison of the statistics of nanoparticle distributions prepared by laser ablation of a flat glass plate and by ablation of 8 μm glass microspheres.

| Fluence (J/cm$^2$) | Threshold Fluence (J/cm$^2$) | N | mean dia (nm) | min. (nm) | max. (nm) | std. dev. σ (nm) | α = σ/dia. |
|---|---|---|---|---|---|---|---|
| Microspheres | | | | | | | |
| 10.5 | 0.5 | 560 | 74 | 32 | 327 | 23 | 0.31 |
| Plate[a] | | | | | | | |
| 10.0 | 7.2 | 224 | 332 | 32 | 930 | 198 | 0.60 |

[a] Not an embodiment of the invention.

EXAMPLE 2

Ablation of Silica Microparticles in a Vacuum

Using the apparatus shown schematically in FIG. 1, 8 micron silica microparticles were dispersed into an argon stream and then the stream was expanded into vacuum using a pulsed nozzle to form a supersonic jet. A divergent, conical nozzle with half angle of 15°, length of 12 mm, and diameter of 0.5 mm was used. In the experiments, room temperature argon at 1000 Torr pressure, was used. The nozzle formed a beam that was approximately 3 mm diameter 20 cm downstream in absence of the skimmer. The microparticles were irradiated transversely to the jet by the laser and collected 5 cm downstream from the laser by a substrate positioned at the edge of the jet. While being illuminated, the microparticles had a particle density of less than 10$^9$ particles per cm$^3$. The conical skimmer sharpened the edge of beam in the vicinity of the collection substrates.

A variable rectangular focus was produced for the excimer laser using crossed cylindrical lenses. By adjusting the aspect ratio of the focus to match the pulse length in space of the nozzle, all of the microparticles in the jet were illuminated. The distribution of ejected nanoparticles as a function of angle between the jet and the laser was measured. No particles were found ejected in the direction of the laser. The estimated jet pressure was 0.1 Torr. Particles were collected by positioning a substrate at a 45° angle in the jet itself. Particles were found on the substrate outside of the beam, but none were observed directly within the beam area. Either the nanoparticles scattered from the surface without sticking, or they were effectively removed by the supersonic argon jet.

The angular distribution of particles produced and the density per unit area on the collection substrates was measured. Based on the number of microparticles irradiated, for the experiments using 248 nm light at a fluence, J=5 J/cm$^2$ the number of nanoparticles that are produced for each microsphere is estimated to be 1×10$^6$. This corresponds to about 10% of the mass of the microparticle being converted to nanoparticles under nonflowing conditions. By using a jet with rectangular cross section, the density and length of the jet can be optimally adjusted to extinguish the laser. The number of nanoparticles produced per second, assuming a laser power of 10 kW (10 J/pulse at 1 kHz) focussed to conditions of 5 J/cm$^2$, is estimated to be approximately two kg/hour (~4×10$^{15}$ particles/sec). Greater production rates could be attained if the required laser fluence is lowered or if the efficiency of converting each microparticle to nanoparticles is increased.

In FIG. 5, a transmission electron micrograph of a silica nanoparticle prepared in this Example is shown.

EXAMPLE 3

Ablation of Gold Microparticles in a Vacuum

Figure 3:
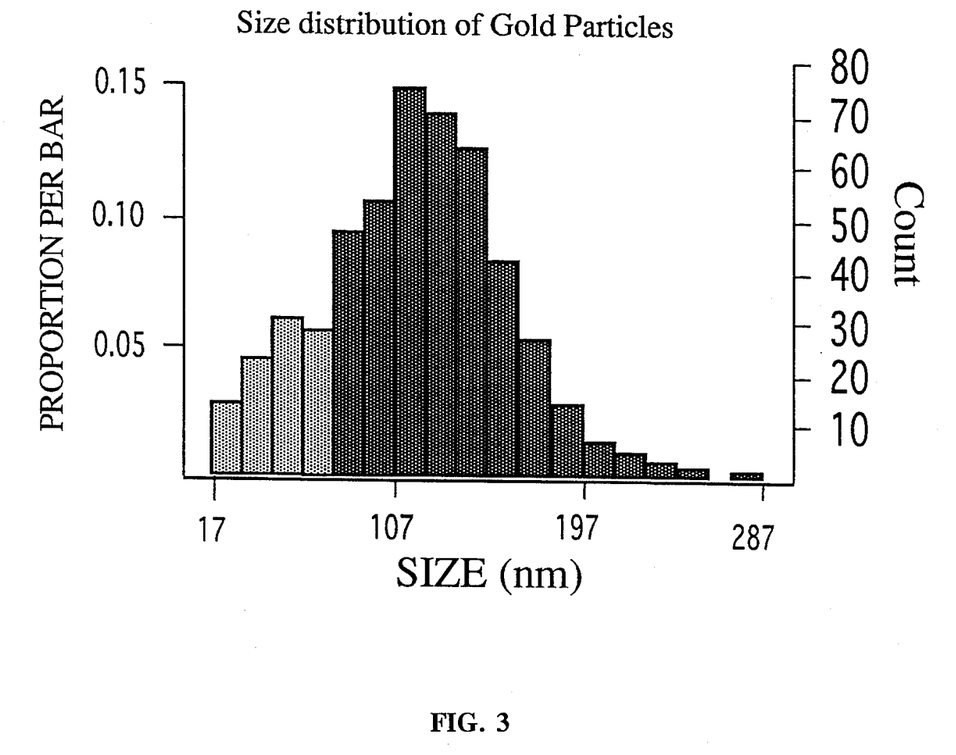
FIG. 3 shows the size distribution of gold nanoparticles produced in Example 3.
Figure 4:
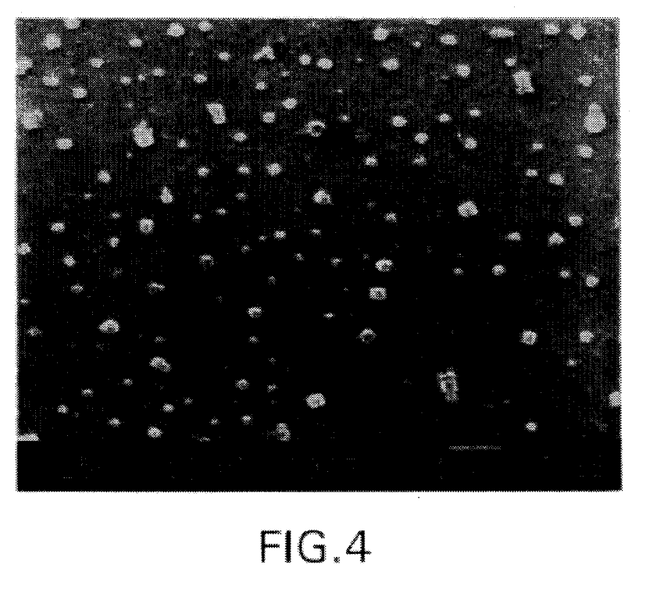
FIG. 4 shows a scanning electron micrograph of gold microparticles used in Example 3.

The procedure of Example 2 was repeated except that 2 micron gold microparticles were substituted for the silica microparticles. The gold nanoparticles produced had a size distribution as shown in FIG. 3. In FIG. 4, a scanning electron micrograph of the gold nanoparticles produced in this invention is shown.

What is claimed is:

1. A process for making nanoparticles, comprising: exposing microparticles to an energy beam that is effective to ablate directly the microparticles under conditions such that a plurality of nanoparticles are formed from each microparticle, the microparticles having a particle density less than 1×10$^9$ particles per cubic centimeter: and wherein the nanoparticles have a dispersion of less than about 0.5.

2. The process of claim 1, wherein energy beam is a laser light of fluence in the range from about 0.1 to about 10 J/cm$^2$ and wherein the laser light is pulsed in a pulse time range of from about 1 nanosecond to about 100 nanoseconds.

3. The process of claim 2, wherein the laser light has a wavelength in the range from about 0.15 to about 11 micron.

4. The process of claim 1, wherein the energy beam is a laser light of an irradiance in the range from about 10$^8$ to about 10$^{11}$ watts/cm$^2$ and wherein the laser light is pulsed in a pulse time less than about 1 nanosecond and or greater than about 100 nanoseconds.

5. The process of claim 1, wherein the microparticles have a diameter in the range from about 1 to about 100 microns.

6. The process of claim 1, wherein the microparticles are gold.

7. The process of claim 1, wherein the process is operated continuously by passing a moving stream of microparticles through the energy beam, the energy beam being pulsed intermittently.

8. The process of claim 1, wherein the nanoparticles have a dispersion of less than about 0.3.

9. A process useful for producing nanoparticles having a diameter in the range from 1 to 1000 nanometers, comprising illuminating microparticles having a diameter in the range from about 0.1 to about 1000 microns with laser light under conditions such that nanoparticles are formed, the laser light having sufficient intensity and appropriate wavelength such that a plasma formation threshold of the microparticles is exceeded by a factor of at least 1.5, and wherein individual microparticles are substantially free from contact with other microparticles while being illuminated with laser light.

10. The process of claim 9, wherein the laser light has a fluence in the range from about 0.1 to about 10 J/cm$^2$ wherein the laser light is pulsed in a pulse time length in range of from about 1 nanosecond to about 100 nanoseconds, and wherein the laser light has a wavelength in the range from about 0.15 to about 11 microns.

11. The process of claim 9, wherein the laser light has an irradiance in the range from about 10$^8$ to about 10$^{11}$ watts/cm$^2$ and wherein the laser light is pulsed in a pulse time less than about 1 nanosecond and greater than about 100 nanoseconds.

12. The process of claim 9, wherein the diameter of the microparticles is in the range from about 1 to about 100 microns.

13. The process of claim 9, wherein the microparticles are silica.

14. The process of claim 9, wherein the microparticles are gold.

15. The process of claim 9, wherein the process is operated continuously by passing a moving stream of microparticles through the laser light, the laser light being pulsed intermittently.

16. The process of claim 15, wherein the laser light has a pulse length in the range from 1 nanosecond to 20 nanoseconds.

17. A process useful for making nanoparticles, comprising:

illuminating microparticles having a mean diameter greater than about 1 micron and less than about 100 microns with laser light of a wavelength and an intensity effective to produce a plurality of nanoparticles from each microparticle, wherein the microparticles have a particle density of less than about $1 \times 10^9$ particles per cubic centimeter, and wherein the nanoparticles have a dispersion of less than about 0.4.

18. The process of claim 17, wherein the laser light has a wavelength in the range from about 0.15 to about 11 micron and a fluence in the range from about 0.1 to about 10 $J/cm^2$, wherein the laser light is pulsed in a pulse length in the range from about 1 nanosecond to about 100 nanoseconds, and wherein the process is operated continuously by passing a moving stream of microparticles through the laser light, the laser light being pulsed intermittently.

19. The process of claim 18, wherein the laser light has an energy at least 1.5 times a plasma formation threshold of the microparticles.

20. The process of claim 17, wherein the microparticles are substantially free of contact between one another.

21. The process of claim 17, wherein the microparticles are gold.

\* \* \* \* \*

UNITED STATES PATENT AND TRADEMARK OFFICE
CERTIFICATE OF CORRECTION

PATENT NO. : 5,585,020

DATED : December 17, 1996

INVENTOR(S) : Michael F. Becker, James R. Brock and John W. Keto

It is certified that error appears in the above-identified patent and that said Letters Patent is hereby corrected as shown below:

In claim 4, column 10, line 31, delete "and".

Signed and Sealed this

Fourth Day of March, 1997

Attest:

BRUCE LEHMAN

Attesting Officer     Commissioner of Patents and Trademarks